(12) United States Patent
Kobayashi

(10) Patent No.: US 10,139,096 B2
(45) Date of Patent: Nov. 27, 2018

(54) LIGHT IRRADIATING DEVICE

(71) Applicant: HOYA CANDEO OPTRONICS CORPORATION, Toda-shi, Saitama (JP)

(72) Inventor: Norio Kobayashi, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 15/393,439

(22) Filed: Dec. 29, 2016

(65) Prior Publication Data

US 2017/0191650 A1 Jul. 6, 2017

(30) Foreign Application Priority Data

Dec. 30, 2015 (JP) ................................. 2015-257725

(51) Int. Cl.
| | |
|---|---|
| *F21V 29/65* | (2015.01) |
| *F21V 29/503* | (2015.01) |
| *F21V 29/505* | (2015.01) |
| *F21V 29/70* | (2015.01) |
| *F21V 29/80* | (2015.01) |

(Continued)

(52) U.S. Cl.
CPC .............. *F21V 29/65* (2015.01); *B05D 3/065* (2013.01); *B41J 11/002* (2013.01); *F21K 9/62* (2016.08); *F21V 7/00* (2013.01); *F21V 29/503* (2015.01); *F21V 29/505* (2015.01); *F21V 29/70* (2015.01); *F21V 29/80* (2015.01); *F21V 31/00* (2013.01); *G02B 19/0019* (2013.01); *G02B 19/0066* (2013.01); *H01L 23/46* (2013.01);

(Continued)

(58) Field of Classification Search
USPC ....................................................... 250/492.1
See application file for complete search history.

(56) References Cited

U.S. PATENT DOCUMENTS 8,888,314 B2 * 11/2014 Gill ....................... F21V 15/015
 362/218
8,920,005 B2 * 12/2014 Ahn ...................... F21V 31/005
 362/373

(Continued)

FOREIGN PATENT DOCUMENTS

| | | |
|---|---|---|
| DE | 10 2009 048662 A1 | 3/2011 |
| GB | 1 380 020 A | 1/1975 |

(Continued)

*Primary Examiner* — Phillip A Johnston
(74) *Attorney, Agent, or Firm* — Rabin & Berdo, P.C.

(57) ABSTRACT

The light irradiating device includes a substrate; a plurality of light emitting diode elements disposed on a surface of the substrate; a cooling unit which is disposed on a rear surface of the substrate; an inner wall which is disposed to enclose a light passage area through which light of the plurality of light emitting diode elements passes; a housing which accommodates the substrate, the plurality of light emitting diode elements, the cooling unit, and the inner wall and generates a space between the inner wall and the housing; an air inlet which introduces air in the light passage area onto the rear surface of the substrate; a flow channel which passes through the rear surface of the substrate and connects the air inlet and the space; and a circulation port which is provided to discharge the air in the space to the light passage area.

8 Claims, 7 Drawing Sheets

(51) Int. Cl.
*F21K 9/62* (2016.01)
*B05D 3/06* (2006.01)
*F21V 7/00* (2006.01)
*F21V 31/00* (2006.01)
*G02B 19/00* (2006.01)
*B41J 11/00* (2006.01)
*H01L 23/46* (2006.01)
*H01L 33/64* (2010.01)
*F21Y 105/16* (2016.01)
*F21Y 115/10* (2016.01)
*H01L 25/075* (2006.01)

(52) U.S. Cl.
CPC ........ *H01L 33/648* (2013.01); *F21Y 2105/16* (2016.08); *F21Y 2115/10* (2016.08); *H01L 25/0753* (2013.01)

(56) References Cited

U.S. PATENT DOCUMENTS 8,931,933 B2 * 1/2015 Tong .................. F21V 29/02
362/373
2010/0259935 A1 10/2010 Scordino et al.

FOREIGN PATENT DOCUMENTS

| JP | S61-82837 A | 4/1986 |
|----|----|----|
| JP | 07-024435 U | 5/1995 |
| JP | 2007-109506 A | 4/2007 |
| JP | 2013-094737 A | 5/2013 |
| JP | 2013-215661 A | 10/2013 |
| JP | 2015-58392 A | 3/2015 |

* cited by examiner

LIGHT IRRADIATING DEVICE

CROSS-REFERENCE TO RELATED APPLICATIONS

This application claims priority to and the benefit of Japanese Patent Application No. 2015-257725 filed in the Japan Intellectual Property Office on Dec. 30, 2015, the entire contents of which are incorporated herein by reference.

TECHNICAL FIELD

The present invention relates to a light irradiating device including a light emitting element such as a light emitting diode (LED) as a light source, and more particularly, to a light irradiating device including a cooling device which radiates heat generated in a light emitting element in a housing.

BACKGROUND ART

In the related art, as an offset sheet-fed printing ink, an ultraviolet curable ink which is cured by irradiating an ultraviolet ray is used. Further, as an adhesive agent around a flat panel display (FPD) such as a liquid crystal panel or an organic electro luminescent (EL) panel, an ultraviolet curable resin is used. In order to cure the ultraviolet curable ink or the ultraviolet curable resin, generally, an ultraviolet ray irradiating device which irradiates an ultraviolet ray is used.

A lamp type irradiating device which uses a high pressure mercury lamp or a mercury xenon lamp as a light source is known as the ultraviolet ray irradiating device in the related art. In recent years, due to demands on reduced power consumption, elongated life-span, and compact device size, an ultraviolet ray irradiating device using an LED as a light source, instead of a discharge lamp of the related art has been developed (for example, see Patent Document 1).

The ultraviolet ray irradiating device disclosed in Patent Document 1 includes a base plate in which a plurality of light emitting elements is two-dimensionally disposed, a reflective tube (mirror unit) which is provided to enclose the base plate to guide the ultraviolet ray emitted from the light emitting elements, and a cooling unit which cools the base plate. Further, the ultraviolet ray is mixed by the reflective tube, so that a uniform irradiating distribution is obtained in an irradiating area. Further, when an LED is used as a light source, most of the supplied power is converted into heat so that the luminous efficiency and the lifespan are lowered due to the heat generated by the LED. Therefore, the ultraviolet ray irradiating device disclosed in Patent Document 1 employs a configuration which suppresses the heat generation of the LED by a cooling unit such as a heat sink.

RELATED ART DOCUMENT

Patent Document

Japanese Patent Application Laid-Open No. 2013-215661

SUMMARY OF THE INVENTION

According to the configuration disclosed in Patent Document 1, the heat generation of the LED is suppressed and a uniform irradiating distribution is obtained in an irradiating area because light from LEDs is mixed by the reflective tube.

However, when the ultraviolet ray is irradiated onto the reflective tube, the reflective tube has a high temperature so that the reflective tube is deformed. Further, when the reflective tube is deformed, the ultraviolet ray is not satisfactorily mixed as designed, so that the irradiating distribution in the irradiating area is not uniform.

The present invention has been made in an effort to provide a light irradiating device which includes a configuration which efficiently cools a member disposed in a light passage area through which the light of an LED passes such as a reflective tube. In order to achieve the above-described object, the light irradiating device of the present invention includes a substrate; a plurality of light emitting diode elements disposed on a surface of the substrate; a cooling unit which is disposed on a rear surface of the substrate and cools the substrate and the plurality of light emitting diode elements; an inner wall which is disposed to enclose a light passage area through which light of the plurality of light emitting diode elements passes; a housing which accommodates the substrate, the plurality of light emitting diode elements, the cooling unit, and the inner wall and generates a space between the inner wall and the housing; an air inlet which introduces air in the light passage area onto the rear surface of the substrate; a flow channel which passes through the rear surface of the substrate and connects the air inlet and the space; and a circulation port which is provided to discharge the air in the space to the light passage area, in which the cooling unit cools the air introduced in the air inlet, and the air is convected between the light passage area and the space.

With this configuration, the air in the inner space of the light irradiating device circulates, so that an internal temperature of the light irradiating device is suppressed from being increased. As a result, the inner wall is efficiently cooled.

Further, the inner wall may include a reflective mirror which guides light from the plurality of light emitting diode elements. As described above, the inner wall may be configured by the reflective mirror, so that the reflective mirror is efficiently cooled.

The housing may include a light emission window which allows the light to pass therethrough and air-tightly closes the light passage area. In this case, a circulation port may be formed between the light emission window and the inner wall.

Further, the inner wall may include an opening and the opening may configure the circulation port.

The light irradiating device may further include a fan which accelerates convection of the air, in an area other than the light passage area.

The light irradiating device may further include a driver circuit which drives the plurality of light emitting diode elements, in the space.

As described above, according to the present invention, a light irradiating device which has a configuration which efficiently cools a member disposed in a light passage area through which the light of LED passes is achieved.

DETAILED DESCRIPTION

Figure 1:
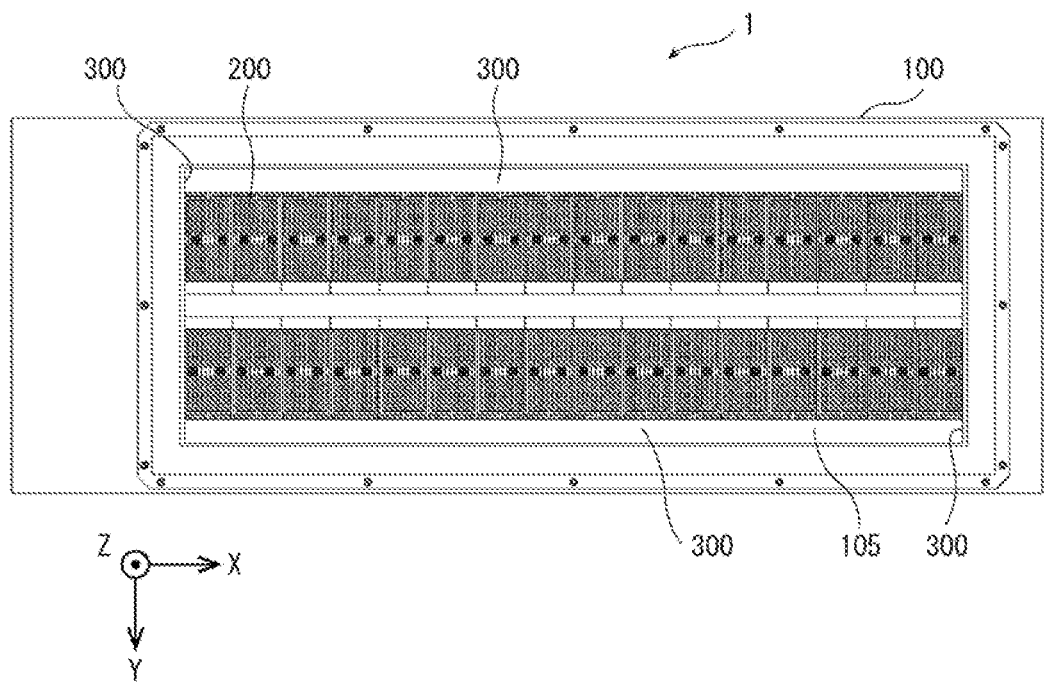
FIG. 1 is a front view illustrating a schematic configuration of a light irradiating device according to a first exemplary embodiment of the present invention.

Hereinafter, exemplary embodiments of the present invention will be described in detail with reference to the drawings. Further, in the drawings, like elements are denoted by like reference numerals, and description thereof will not be repeated.

First Exemplary Embodiment

Figure 2:
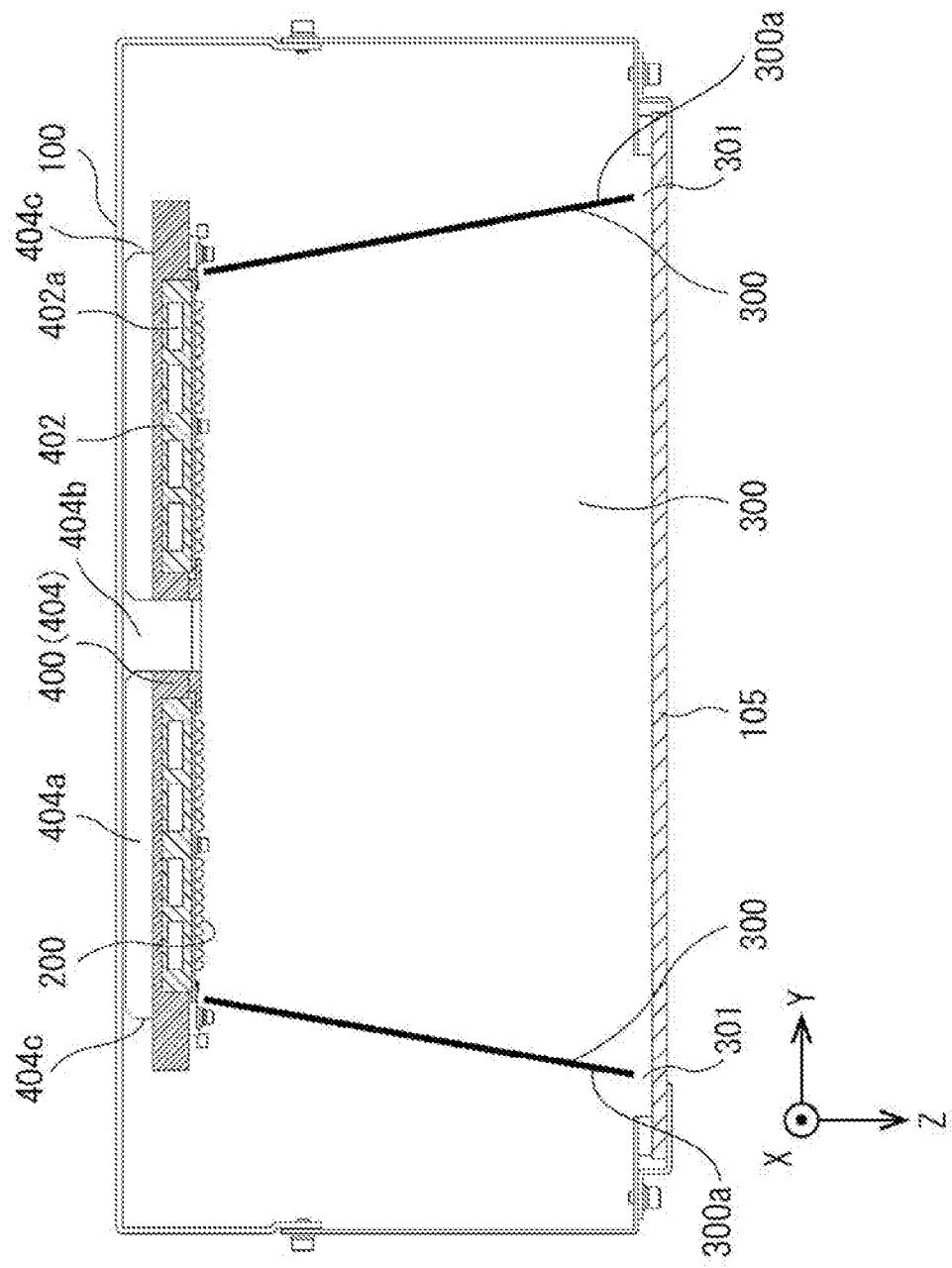
FIG. 2 is a cross-sectional view of a Y-Z plane illustrating an inner configuration of a light irradiating device according to a first exemplary embodiment of the present invention.

FIG. 1 is a front view illustrating a schematic configuration of a light irradiating device 1 according to a first exemplary embodiment of the present invention. FIG. 2 is a cross-sectional view of a Y-Z plane illustrating an inner configuration of a light irradiating device 1. The light irradiating device 1 of the exemplary embodiment is a light source device which is mounted on a printing apparatus to cure an ultraviolet curable ink or an ultraviolet curable resin. For example, a front surface (a surface on which a window 105 is disposed) is disposed above an object to be irradiated to be opposite to the object to be irradiated and a linear ultraviolet ray is downwardly emitted onto the object to be irradiated. Further, in this specification, as illustrated in a coordinate of FIGS. 1 and 2, a direction in which a light emitting diode (LED) element 210 (which will be described below) which emits an ultraviolet ray is defined as a Z-axis direction, a length direction of the light irradiating device 1 is defined as an X-axis, and a direction perpendicular to the Z-axis direction and the X-axis direction (a smaller length direction of the light irradiating device 1) is defined as a Y-axis direction.

As illustrated in FIGS. 1 and 2, the light irradiating device 1 of the exemplary embodiment includes a box shaped case 100 (housing) in which an LED module 200, a reflective mirror 300, and a heat radiating member 400 are accommodated. The case 100 includes a window 105 formed of glass through which the ultraviolet ray is emitted, in the front surface. Further, on a rear surface (which is opposite to the front surface) of the case 100, a connector (not illustrated) which supplies power to the light irradiating device 1 or a coolant coupler (not illustrated) which supplies coolant to the heat radiating member 400 is provided. The connector (not illustrated) is connected to a power supply which is not illustrated through a cable which is not illustrated to supply power to the light irradiating device 1. Further, a coolant supply device which is not illustrated is connected to the coolant coupler (not illustrated) so that the coolant is supplied to the heat radiating member 400.

Figure 3:
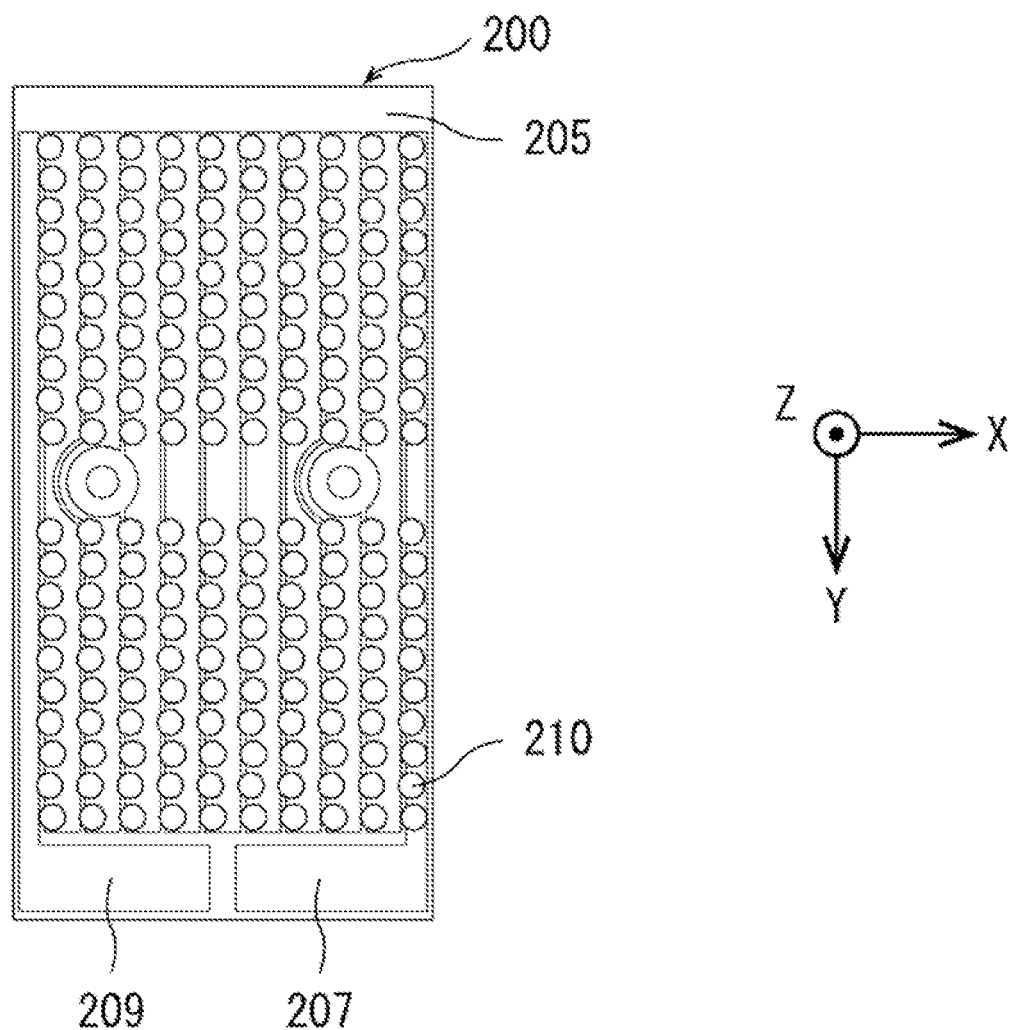
FIG. 3 is a view of a configuration of a LED module provided in a light irradiating device according to a first exemplary embodiment of the present invention.

FIG. 3 is a view illustrating a configuration of the LED module 200 of the exemplary embodiment. Further, FIGS. 4A and 4B are, respectively, is a view illustrating a configuration of a heat radiating member 400 of the exemplary embodiment, FIG. 4A is a front perspective view of the heat radiating member 400 as seen from the front side (a window 105 side) and FIG. 4B is a rear perspective view of the heat radiating member 400 as seen from a rear side.

Figure 4A:
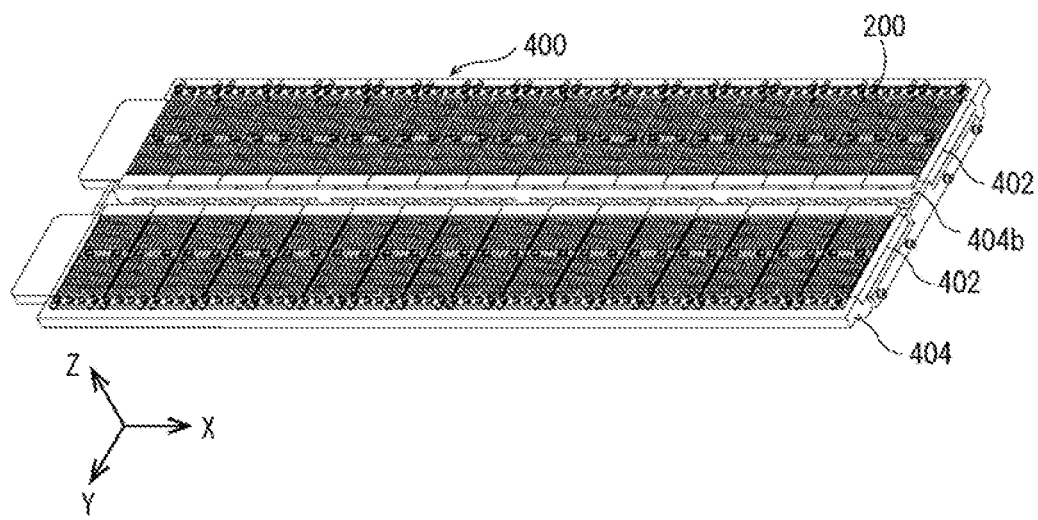
FIG. 4A and FIG. 4B are, respectively, a view of a configuration of a heat radiating member provided in a light irradiating device according to a first exemplary embodiment of the present invention.
Figure 4B:
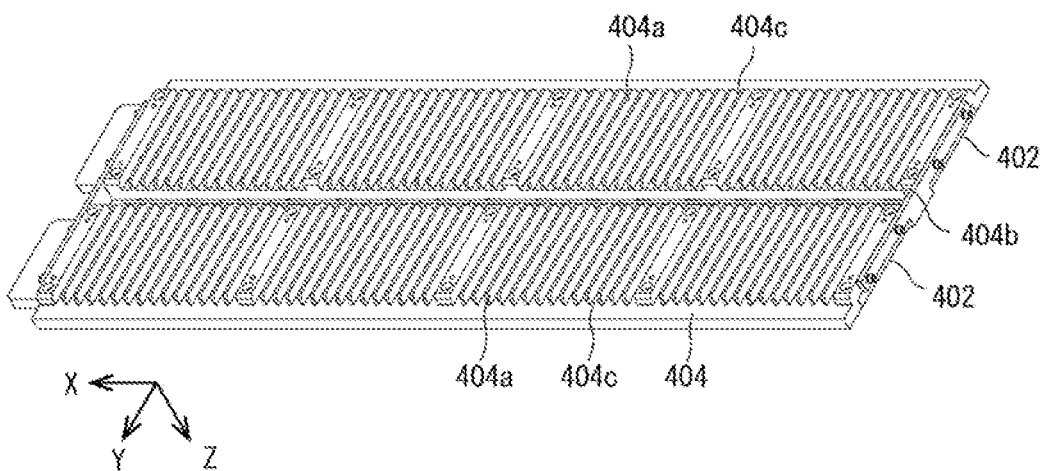

As illustrated in FIGS. 3 and 4A, the LED module 200 includes a rectangular substrate 205 which is parallel to the X-axis direction and the Y-axis direction and a plurality of LED elements 210 on the substrate 205. Further, two columns of 16 LED modules 200 are disposed and fixed onto one end face (a surface facing the front side of the case 100) of a water cooling heat sink 402 which extends in the case 100 in the X-axis direction.

As illustrated in FIG. 3, the LED module 200 of the exemplary embodiment includes 200 LED elements 210 which are disposed on the substrate 205 by 20 columns (Y-axis direction) by 10 LED elements (X-axis direction). The 200 LED elements 210 are disposed on a surface of the substrate 205 such that an optical axis is arranged in the Z-axis direction. An anode pattern 207 and a cathode pattern 209 which supply power to each of the LED elements 210 are formed on the substrate 205. Each LED element 210 is soldered to the anode pattern 207 and the cathode pattern 209 to be electrically connected to each other. Further, the substrate 205 is electrically connected to the driver circuit which is not illustrated by a wiring cable which is not illustrated. Further, a driving current is supplied to each LED elements 210 from the driver circuit, by means of the anode pattern 207 and the cathode pattern 209. When the driving current is supplied to each LED element 210, an ultraviolet ray (for example, 385 nm of a wavelength) with a light quantity in accordance with the driving current is emitted from each LED element 210. As illustrated in FIGS. 4A and 4B, in the exemplary embodiment, two columns of 16 LED modules 200 are arranged on one end face of the water cooling heat sink 402 and a linear ultraviolet ray which extends in the X-axis direction is emitted from the light irradiating device 1 of the exemplary embodiment. Further, a driving current which is supplied to each LED element 210 is adjusted to allow each LED element 210 of the exemplary embodiment to emit the ultraviolet ray having substantially the same light quantity. Further, the linear ultraviolet ray emitted from the light irradiating device 1 has substantially uniform light intensity distribution in the X-axis direction and the Y-axis direction.

Further, as illustrated in FIGS. 1 and 2, in the light irradiating device 1 of the exemplary embodiment, four reflective mirrors 300 are disposed to enclose two columns of 16 LED modules 200 (that is, enclose a light passage area through which the light of the LED elements 210 passes). The ultraviolet ray emitted from each LED element 210 is mixed by four reflective mirrors 300 to have a more uniform light intensity distribution in an object to be irradiated.

The heat radiating member 400 is a member which fixes the LED modules 200 and radiates heat generated from each LED module 200. The heat radiating member 400 is configured by two water cooling heat sinks 402 which are formed of metal such as copper having high heat conductivity and a heat radiating frame 404 which is fixed to another end face of two water cooling heat sinks 402 to be thermally coupled and support the two water cooling heat sink 402. Further, as illustrated in FIGS. 4A and 4B, at a center of the heat radiating frame 404 in the Y-axis direction (that is, between two water cooling heat sinks 402), an air inlet 404b through which air heated in the light passage area (an area enclosed by the reflective mirrors 300) flows is formed.

The water cooling heat sink 402 is a panel shaped member in which the LED module 200 is mounted on one end face and a plurality of water channels 402a (see FIG. 2) through which coolant passes is formed in the water cooling heat sink 402.

The heat radiating frame 404 is a rectangular panel shaped metal member which cools air flowed from the air inlet 404b. A plurality of heat radiating pins 404a which is erected in a direction opposite to the Z-axis direction and extends in the Y-axis direction is formed on the other end face (a surface opposite to the surface to which the water cooling heat sink 402 is fixed) of the heat radiating frame 404. The plurality of heat radiating pins 404a is disposed to be divided into two groups in the Y-axis direction with respect to the air inlet 404b and the air which flows therein from the air inlet 404b flows between the heat radiating pins 404a which are divided into two groups to be cooled. That is, a flow channel through which air flowing from the air inlet 404b flows is formed between the heat radiating pins 404a. Further, an outer end (an end opposite to the air inlet 404b) of each heat radiating pin 404a forms an air outlet 404c through which air flowing from the air inlet 404b is discharged, between the outer end of the heat radiating pin 404a and an outer end of adjacent heat radiating pin 404a. As described above, the heat radiating member 400 of the embodiment of the exemplary embodiment is configured to radiate heat generated in each LED module 200 by the water cooling heat sink 402 and cool air flowing from the air inlet 404b using a rear surface of the water cooling heat sink 402. Further, the cooled air which is discharged from the air outlet 404c flows in a space between the case 100 and the reflective mirror 300 to cool the reflective mirror 300 and passes through a circulation port 301 (see FIG. 2) formed between a leading edge 300a of the reflective mirror 300 and the window 105 to be discharged to the light passage area (details will be described below).

Figure 5:
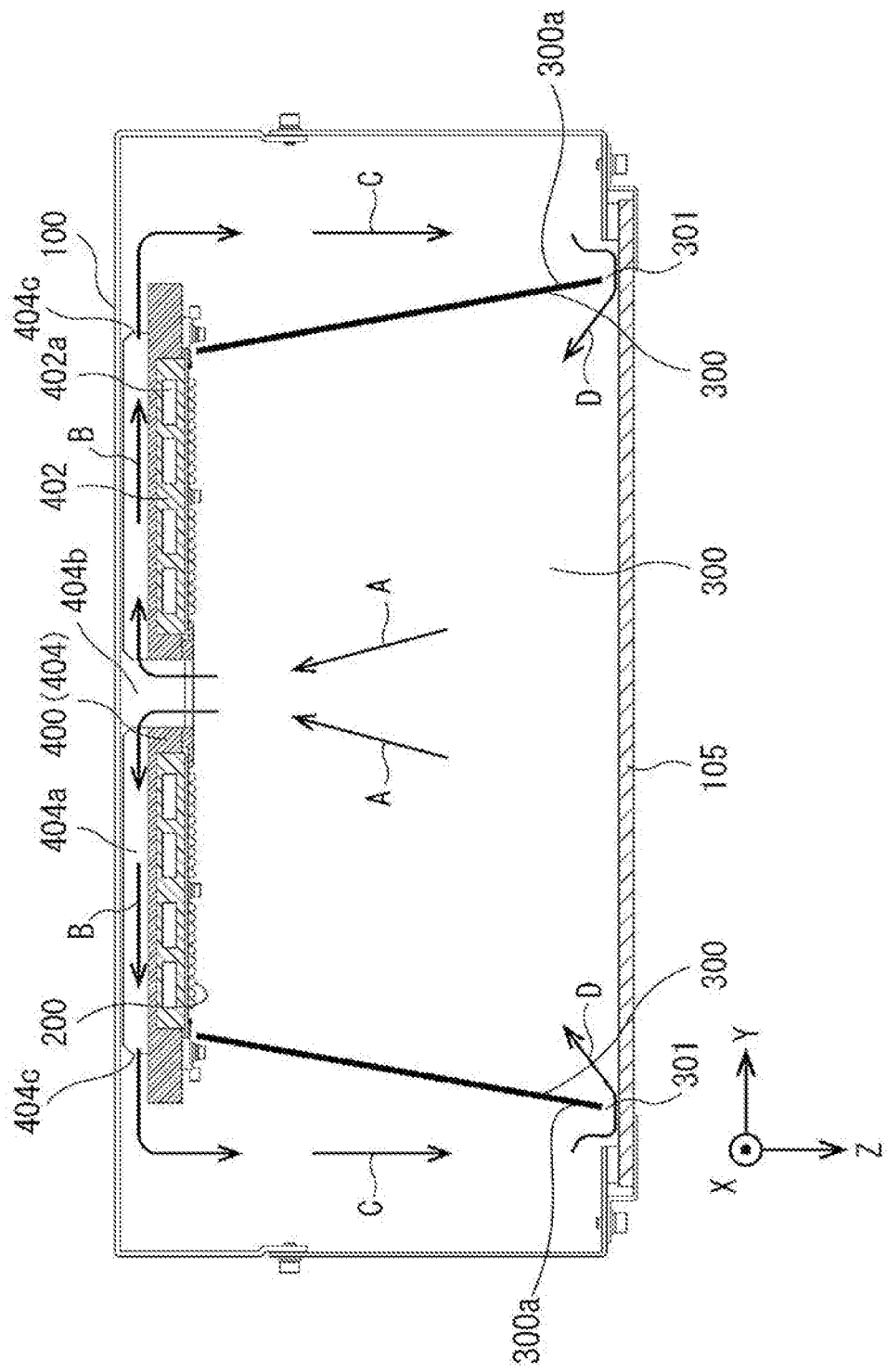
FIG. 5 is a view illustrating a configuration of a reflective mirror provided in a light irradiating device according to a first exemplary embodiment of the present invention and a process of cooling the reflective mirror.

FIG. 5 is a cross-sectional view of a Y-Z plane of a light irradiating device 1 illustrating a configuration of a reflective mirror 300 of the exemplary embodiment of the present invention and a process of cooling the reflective mirror 300.

As described above, four reflective mirrors 300 of the exemplary embodiment are members for mixing ultraviolet ray emitted from each LED element 210 and are slantly provided to be gradually broader from each side of the heat radiating frame 404 to the window 105. When the ultraviolet ray from each LED element 210 is mixed by the reflective mirror 300, a uniform light intensity distribution is obtained on the object to be irradiated.

However, when the ultraviolet ray from each LED element 210 touches the reflective mirror 300, some of the light which is absorbed by the reflective mirror 300 is converted into heat. Therefore, the temperature of the reflective mirror 300 is increased to be high, so that the reflective mirror 300 is deformed. Further, in the exemplary embodiment, the reflective mirror 300 is covered by the window 105, so that the reflective mirror 300 has a high temperature and thus air of the light passage area (an area enclosed by the reflective mirrors 300) is heated. Further, a temperature in the light irradiating device 1 is increased, which may adversely affect the LED elements 210 or other electric components. Therefore, in order to solve the above-mentioned problem, in the exemplary embodiment, the air inlet 404b is provided in the heat radiating frame 404 to cool not only each LED module 200, but also air received from the air inlet 404b, thereby cooling the air of the light passage area (the area enclosed by the reflective mirrors 300) and the reflective mirrors 300.

An arrow of FIG. 5 indicates an air flow direction. As illustrated in FIG. 5, when each LED element 210 emits light and the ultraviolet light from each LED element 210 touches the reflective mirrors 300, the reflective mirrors 300 have a high temperature. Therefore, the air of the light passage area (the area enclosed by the reflective mirrors 300) is heated. A specific gravity of the heated air is light so that the heated air ascends and flows into the other end face of the heat radiating frame 404 from the air inlet 404b (see the arrow A). Further, the air which flows onto the other end face of the heat radiating frame 404 is cooled by being in contact with the heat radiating pin 404a in a space between the case 100 and the heat radiating frame 404. Therefore, a specific gravity thereof is increased and the air passes between the heat radiating pins 404a (see an arrow B) to be discharged from the air outlet 404c. Further, the air discharged from the air outlet 404c flows in a space between the case 100 and the reflective mirror 300 (see an arrow C). Therefore, the cooled air is in contact with a rear surface of the reflective mirror 300 to cool the reflective mirror 300.

Further, as described above, in the exemplary embodiment, a small gap and a circulation port 301 are formed between a leading edge 300a of the reflective mirror 300 and the window 105. Further, the cooled air between the case 100 and the reflective mirror 300 passes through the circulation port 301 port to flow in the light passage area (see an arrow D). Therefore, according to the configuration of the exemplary embodiment, the air in the light passage area is also cooled.

As described above, in the exemplary embodiment, the air inlet 404b is provided in the heat radiating frame 404 and the air is naturally convected between the light passage area and the space between the case 100 and the reflective mirror 300 using a rear surface of the water cooling heat sink 402, thereby cooling the reflective mirror 300 and the air in the light passage area.

Therefore, even though the ultraviolet ray from each LED element 210 touches the reflective mirror 300, the temperature of the reflective mirror 300 is not increased and the reflective mirror 300 is not deformed. Further, the temperature in the light irradiating device 1 is suppressed from being increased, which does not adversely affect the LED element 210 or other electric components.

(Effect Confirmation Experiment)

Figure 6:
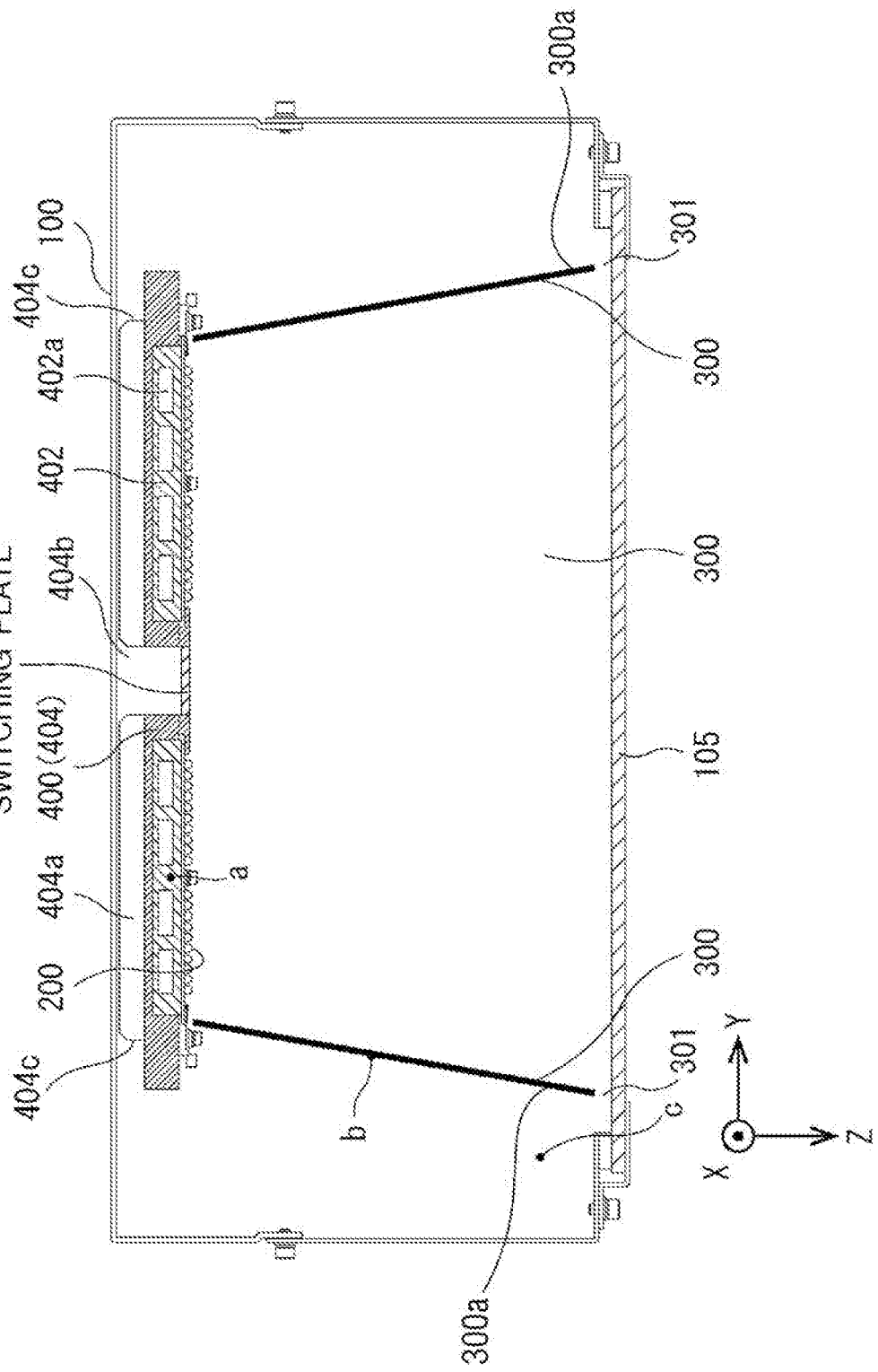
FIG. 6 is a view illustrating a position where a temperature is measured during an effect confirmation experiment of the present invention.

Table 1 is a table which explains a result of an effect confirmation experiment of the present invention. In a state where the air inlet 404b is not provided (that is, the air inlet 404b is closed by a switching plate) and a state where the air inlet 404b is open (that is, the configuration of the exemplary embodiment), temperatures in measurement positions illustrated in FIG. 6 are measured by a thermocouple and the result is represented in Table 1. Further, the switching plate illustrated in FIG. 6 is used to close the air inlet 404b in the effect confirmation experiment for the purpose of convenience but does not configure the light irradiating device 1 of the exemplary embodiment.

TABLE 1

| Air inlet | Measurement position | | |
|---|---|---|---|
| | a<br>Heat sink<br>402 | b<br>Reflective<br>mirror 300 | c<br>Inner space<br>of case 100 |
| close | 28.2 | 100.9 | 76.8 |
| open | 27.4 | 86.6 | 72.0 |
| Temperature<br>difference | 0.8 | 14.3 | 4.8 |

Further, as illustrated in FIG. 6, a temperature of two water cooling heat sinks 402 is obtained in a measurement position a, a temperature of a rear surface of the reflective mirror 300 is obtained in a measurement position b, and an air temperature in a space between the case 100 and the reflective mirror 300 is obtained in a measurement position c. Further, the measurement value of Table 1 is at the highest temperature (° C.) while lighting each LED element 210 at a full power for 60 minutes. Further, in the measurement in Table 1, a temperature of a coolant which is supplied to the water cooling heat sink 402 is 23° C. and a flow rate is 15 L/min. Further, the "temperature difference" in Table 1 is a difference between a temperature when the air inlet 404b is closed and a temperature when the air inlet 404b is open.

Consideration)

As represented in Table 1, according to data of the measurement position a, it is understood that since the coolant passes through the water cooling heat sink 402 regardless of presence of the air inlet 404b, the temperature difference is rarely caused. Further, according to data of the measurement position b, it is understood that when the air inlet 404b is provided, the temperature of the reflective mirror 300 is lowered by approximately 14.3° C. Furthermore, according to data of the measurement position c, it is understood that an air temperature in the space between the case 100 and the reflective mirror 300 is lowered by approximately 4.8° C.

Even though the exemplary embodiment has been described above, the present invention is not limited to the above-described configuration and may be modified in various forms within a scope of a technical spirit of the present invention.

For example, it is described that the light irradiating device 1 of the exemplary embodiment is disposed above the object to be irradiated to irradiate a downward ultraviolet ray onto the object to be irradiated. However, the air in the light passage area may flow in the air inlet 404b. For example, the light irradiating device 1 is laterally disposed to irradiate a lateral ultraviolet ray onto the object to be irradiated. Further, even though the exemplary embodiment employs a configuration in which the air in the light passage area is naturally convected, the present invention is not limited to this configuration. For example, a fan may be provided in a convection path of the air (that is, an area other than the light passage area) to forcibly convect the air in the light passage area.

Further, even though the exemplary embodiment employs a configuration in which the air inlet 404b is provided at the center of the heat radiating frame 404 in the Y-axis direction (that is, between 16 LED modules 200 which are arranged in two columns), the present invention is not limited to this configuration. If the air in the light passage area flows in the air inlet 404b, the air inlet 404b may be provided in any positions. Further, even though the exemplary embodiment employs a configuration in which the reflective mirrors 300 which enclose the LED modules 200 are provided to cool the reflective mirrors 300 by naturally convecting the air in the air passage area, the reflective mirrors 300 may not necessarily provided. For example, instead of the reflective mirrors 300, an inner wall which encloses the LED modules 200 may be provided. In this case, the air in the light passage area is naturally convected to lower a temperature of the inner wall.

Further, in the exemplary embodiment, the air temperature in the space between the case 100 and the reflective mirror 300 can be lowered, so that a driver circuit which supplies a driving current to each LED element 210 may be disposed between the case 100 and the reflective mirror 300.

Further, in the exemplary embodiment, the window 105 is disposed at the leading edge 300a of the reflective mirror 300, but the window 105 may not be necessarily provided. When the window 105 is removed, outside air flows in the light passage area and the air in the light passage area convects, so that the light passage area is maintained at a low temperature.

In the LED modules 200 of the exemplary embodiment, 200 LED elements 210 which are disposed on the substrate 205 in a matrix of 20 columns (Y-axis direction) by 10 LED elements (X-axis direction) are provided. However, the present invention is not limited to this configuration. The LED elements 210 may be disposed in one line or may be alternately disposed. Further, even though the optical axes of all the LED elements 210 are aligned to the Z-axis, for example, optical axes of some LED elements 210 may be directed to a direction other than the Z-axis direction.

Further, even though the heat radiating member 400 of the exemplary embodiment has the water cooling heat sink 402, liquid cooling may be employed instead of water. Further, instead of the water cooling heat sink 402, a heat pipe, a Peltier cooler (Peltier element), or a cooling fan may be applied.

Second Exemplary Embodiment

Figure 7:
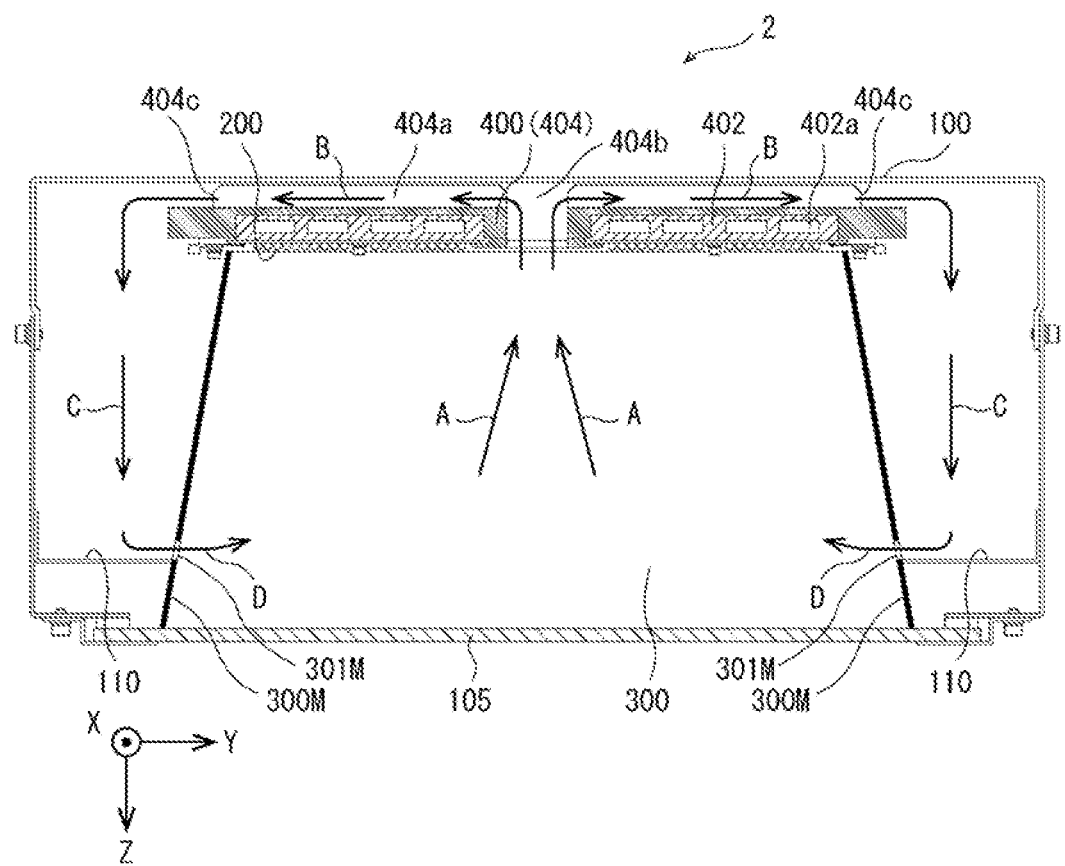
FIG. 7 is a view illustrating a configuration of a light irradiating device according to a second exemplary embodiment of the present invention.

FIG. 7 is a cross-sectional view of a Y-Z plane illustrating an inner configuration of a light irradiating device 2 according to a second exemplary embodiment of the present invention. The light irradiating device 1 according to the first exemplary embodiment includes the circulation port 301 formed between the leading edge 300a of the reflective mirror 300 and the window 105. However, in the light irradiating device 2 according to the second exemplary embodiment, instead of the circulation port 301, a circulation port 301M is formed in two sheets of reflective mirrors 300M which are disposed in the Y-axis direction, which is different from the light irradiating device 1 according to the first exemplary embodiment.

As illustrated in FIG. 7, the reflective mirror 300M of the exemplary embodiment includes a slit shaped opening which extends in the X-axis direction and the opening configures the circulation port 301M. Further, in the case 100, a partition panel 110 which partitions a space between the case 100 and the reflective mirror 300M is formed along a lower edge (an edge in the Z-axis direction) of the circulation port 301M. Therefore, the air discharged from the air outlet 404c flows in the space between the case 100 and the reflective mirror 300M (see an arrow C) to cool the reflective mirror 300M and pass the circulation port 301M along the partition panel 110 to flow in the light passage area (see an arrow D). Therefore, according to the configuration of the exemplary embodiment, similarly to the first exemplary embodiment, not only the reflective mirror 300M, but also the air in the light passage area is cooled.

Further, the circulation port 301M is not limited to a slit shaped opening, but may be a plurality of openings formed along the X-axis direction. Further, similarly to the first exemplary embodiment, also in the exemplary embodiment, the window 105 may be removed. When the window 105 is removed, the outside air flows in the light passage area to convect the air in the light passage area. Therefore, the light passage area is maintained at a low temperature.

The disclosed exemplary embodiments are illustrative at every aspect but are not restrictive. The scope of the present invention is represented not by the above description, but by claims and it is intended that all changes are included within an equivalent meaning and range to a scope of the claims.

EXPLANATION OF REFERENCE NUMERALS AND SYMBOLS

1, 2 Light irradiating device
100 Case
105 Window
110 Partition panel
200 LED module
205 Substrate
207 Anode pattern
209 Cathode pattern
210 LED element
300, 300M Reflective mirror
300*a* Leading edge
301, 301M Circulation port
400 Heat radiating member
402 Water cooling heat sink
402*a* Water channel
404 Heat radiating frame
404*a* Heat radiating pin
404*b* Air inlet
404*c* Air outlet

What is claimed is:

1. A light irradiating device comprising:
a substrate;
a plurality of light emitting diode elements disposed on a surface of the substrate;
a cooling unit which is disposed in contact with a rear surface of the substrate and cools the substrate and the plurality of light emitting diode elements;
an inner wall which is disposed to enclose a light passage area through which light of the plurality of light emitting diode elements passes;
a box shaped housing which accommodates the substrate, the plurality of light emitting diode elements, the cooling unit, and the inner wall and generates a space between the inner wall and the housing;
an air inlet which introduces air in the light passage area onto the rear surface of the substrate;
a flow channel which passes through a rear surface of the cooling unit and connects the air inlet and the space; and
a circulation port which is provided to discharge the air in the space to the light passage area,
wherein the cooling unit cools the air introduced in the air inlet, the air is convected between the light passage area and the space, and the housing includes a light emission window which allows the light to pass therethrough and air-tightly closes the light passage area.

2. The light irradiating device of claim 1, wherein the circulation port is formed between the light emission window and the inner wall.

3. The light irradiating device of claim 1, wherein the inner wall includes an opening and the opening configures the circulation port.

4. The light irradiating device of claim 1, further comprising:
a fan which accelerates convection of the air, in an area other than the light passage area.

5. The light irradiating device of claim 1, further comprising:
a driver circuit which drives the plurality of light emitting diode elements, in the space.

6. The light irradiating device of claim 1, wherein the air inlet is in a substantially central region of the housing, between two heat radiating frames.

7. The light irradiating device of claim 1, wherein the light emission window is substantially planar.

8. The light irradiating device of claim 7, wherein the inner wall is substantially planar, and the circulation port is between an end of the inner wall and an inner surface of the light emission window.

\* \* \* \* \*